United States Patent
Goh et al.

(10) Patent No.: US 10,530,348 B2
(45) Date of Patent: Jan. 7, 2020

(54) SHIFT REGISTER UTILIZING LATCHES CONTROLLED BY DUAL NON-OVERLAPPING CLOCKS

(71) Applicant: STMicroelectronics Asia Pacific Pte Ltd, Singapore (SG)

(72) Inventors: Beng-Heng Goh, Singapore (SG); Yi Ren Chin, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 16/273,317

(22) Filed: Feb. 12, 2019

(65) Prior Publication Data

US 2019/0173458 A1 Jun. 6, 2019

Related U.S. Application Data

(62) Division of application No. 15/425,277, filed on Feb. 6, 2017, now Pat. No. 10,243,545.

(51) Int. Cl.
| | |
|---|---|
| *G11C 7/22* | (2006.01) |
| *H03K 5/151* | (2006.01) |
| *G11C 19/28* | (2006.01) |
| *H03L 7/00* | (2006.01) |

(52) U.S. Cl.
CPC ............ *H03K 5/1515* (2013.01); *G11C 7/22* (2013.01); *G11C 7/222* (2013.01); *G11C 19/28* (2013.01); *G11C 19/287* (2013.01); *H03L 7/00* (2013.01)

(58) Field of Classification Search
CPC ........ H03K 5/1515; G11C 7/22; G11C 7/222; G11C 19/28; G11C 19/287; H03L 7/00
USPC .......................................................... 327/153
See application file for complete search history.

(56) References Cited

U.S. PATENT DOCUMENTS

| | | | |
|---|---|---|---|
| 5,173,618 A * | 12/1992 | Eisenstadt | H03K 5/1515 327/218 |
| 5,379,325 A * | 1/1995 | Katayama | H04L 7/033 326/93 |
| 5,999,030 A | 12/1999 | Inoue | |
| 9,625,938 B2 | 4/2017 | Thazhatheppattu et al. | |
| 9,634,649 B2 | 4/2017 | Escobar et al. | |
| 2007/0150780 A1 | 6/2007 | Shimooka | |

* cited by examiner

*Primary Examiner* — Dinh T Le
(74) *Attorney, Agent, or Firm* — Crowe & Dunlevy

(57) ABSTRACT

An electronic device includes clock generation circuitry. The clock generation circuitry includes a first flip flop receiving as input a device clock and being triggered by an input clock and a second flip flop receiving, as input, output from the first flip flop and being triggered by the input clock. A first inverter receives output from the first flip flop as input and a second inverter receives output from the second flip flop as input. A first AND gate receives, as input, output from the second flip flop and the first inverter, and generates a first clock as output. A second AND gate receives, as input, output from the first flip flop and the second inverter, and generates a second clock as output.

18 Claims, 4 Drawing Sheets

US 10,530,348 B2

SHIFT REGISTER UTILIZING LATCHES CONTROLLED BY DUAL NON-OVERLAPPING CLOCKS

CROSS REFERENCE TO RELATED APPLICATION

This application is a divisional of U.S. application patent Ser. No. 15/425,277, entitled "SHIFT REGISTER UTILIZING LATCHES CONTROLLED BY DUAL NON-OVERLAPPING CLOCKS", filed Feb. 6, 2017, the contents of which are incorporated by reference in their entirety.

TECHNICAL FIELD

This disclosure is related to the field of shift registers, and, more particularly, to a shift register constructed from master-slave latch arrangements controlled by dual non-overlapping clocks, capable of performing bi-directional shifts, and being insensitive to voltage, temperature, and process variations.

BACKGROUND

In digital circuits, a shift register may be constructed from a cascade of flip flops, each sharing the same clock. In such a shift register, the output of each flip flop is connected to the input of the next flip flop in the chain, resulting in a circuit that shifts by one position the bit array stored in it, shifting in the data present at its input and shifting out the last bit in the array, at each transition of the clock.

However, such conventional shift registers have a variety of undesirable drawbacks. For example, many are unidirectional, being only capable of shifting data in one direction. As another example, such conventional shift registers are sensitive to minor temperature and voltage variations, meaning that errors may occur in some operating scenarios.

Therefore, further development in the area of shift registers is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device including a flip flop and clock generation circuitry for controlling the flip flop. The flip flop includes a master latch receiving input for the flip flop, with the master latch latching the received input to its output in response to a first clock. The slave latch receives input from the output of the master latch, and latches the received input to its output in response to a second clock. The clock generation circuitry is configured to logically combine a device clock and an input clock to produce the first and second clocks.

The clock generation circuit may logically combine the device clock and the input clock by synchronizing the device clock to the input clock to generate a first intermediate clock, delaying the first intermediate clock by one clock period to produce a second intermediate clock, generating the first clock as a function of a logical AND operation between the second intermediate clock and an inverse of the first intermediate clock, and generating the second clock as a function of a logical AND operation between the first intermediate clock and an inverse of the second intermediate clock.

The flip flop may be within a first chain of flip flops in which inputs of successive flip flops of a given chain of flip flops receive output from preceding flip flops of that chain of flip flops.

The electronic device may include second and third chains of flip flops in which inputs of successive flip flops of a given chain of flip flops receive output from preceding flip flops of that chain of flip flops. A multiplexer may receive, as input, outputs from the first and third chains of flip flops, and selectively multiplex one of the outputs from the first and third chains of flip flops to an input of the second chain of flip flops.

In some cases, each of the flip flops of the first, second, and third chains may include a master latch receiving input for the flip flop and latching the received input to its output in response to a first clock, and a slave latch receiving input from the output of the master latch and latching the received input to its output in response to a second clock.

The clock generation circuitry may include a first flip flop receiving as input a device clock and being triggered by an input clock, and a second flip flop receiving as input output from the first flip flop and being triggered by the input clock.

The clock generation circuitry may include a first inverter receiving output from the first flip flop as input, a second inverter receiving output from the second flip flop as input, and a first AND gate receiving, as input, output from the second flip flop and the first inverter, and configured to generate the first clock as output. A second AND gate may receive, as input, output from the first flip flop and the second inverter, and may be configured to generate the second clock as output.

At least one buffer may be configured to buffer the first clock, and at least one buffer may be configured to buffer the second clock. In some cases, a first buffer chain may be coupled to the first clock, with the first buffer chain including first, second, and third buffers coupled in series, and a second buffer chain may be coupled to the second clock, with the second buffer chain including fourth, fifth, and sixth buffers coupled in series.

Output of the first buffer may be coupled to the first chain of flip flops to provide the first clock thereto, output of the second buffer may be coupled to the second chain of flip flops to provide the first clock thereto, and output of the third buffer may be coupled to the third chain of flip flops to provide the first clock thereto.

Output of the fourth buffer may be coupled to the first chain of flip flops to provide the second clock thereto, output of the fifth buffer may be coupled to the second chain of flip flops to provide the second clock thereto, and output of the sixth buffer may be coupled to the third chain of flip flops to provide the second clock thereto.

Another aspect disclosed herein is an electronic device having a chain of flip flops in which inputs of successive flip flops of a given chain of flip flops receive output from preceding flip flops of that chain of flip flops. Each of the flip flops of the chain of flip flops includes a master latch receiving input for the flip flop and latching the received input to its output in response to a first clock, and a slave latch receiving input from the output of the master latch and latching the received input to its output in response to a second clock.

Clock generation circuitry used within the electronic device may include a first flip flop receiving as input a device clock and being triggered by an input clock, and a second flip flop receiving, as input, output from the first flip flop and being triggered by the input clock. A first inverter receives output from the first flip flop as input, and a second inverter receives output from the second flip flop as input. A first AND gate receives, as input, output from the second flip flop and the first inverter, and is configured to generate the first clock as output. A second AND gate receives, as input, output from the first flip flop and the second inverter, and is configured to generate the second clock as output.

Also disclosed herein is a method aspect. The method includes synchronizing a device clock to an input clock to generate a first intermediate clock and delaying the first intermediate clock by one clock period to produce a second intermediate clock. The method also includes generating a first clock as a function of a logical AND operation between the second intermediate clock and an inverse of the first intermediate clock, and generating a second clock as a function of a logical AND operation between the first intermediate clock and an inverse of the second intermediate clock.

The method may also include shifting data through a flip flop chain by controlling master latches of flip flops of the flip flop chain based upon the first clock and by controlling slave latches of the flip flops of the flip flop chain based upon the second clock. The first and second clocks may be buffered.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1:
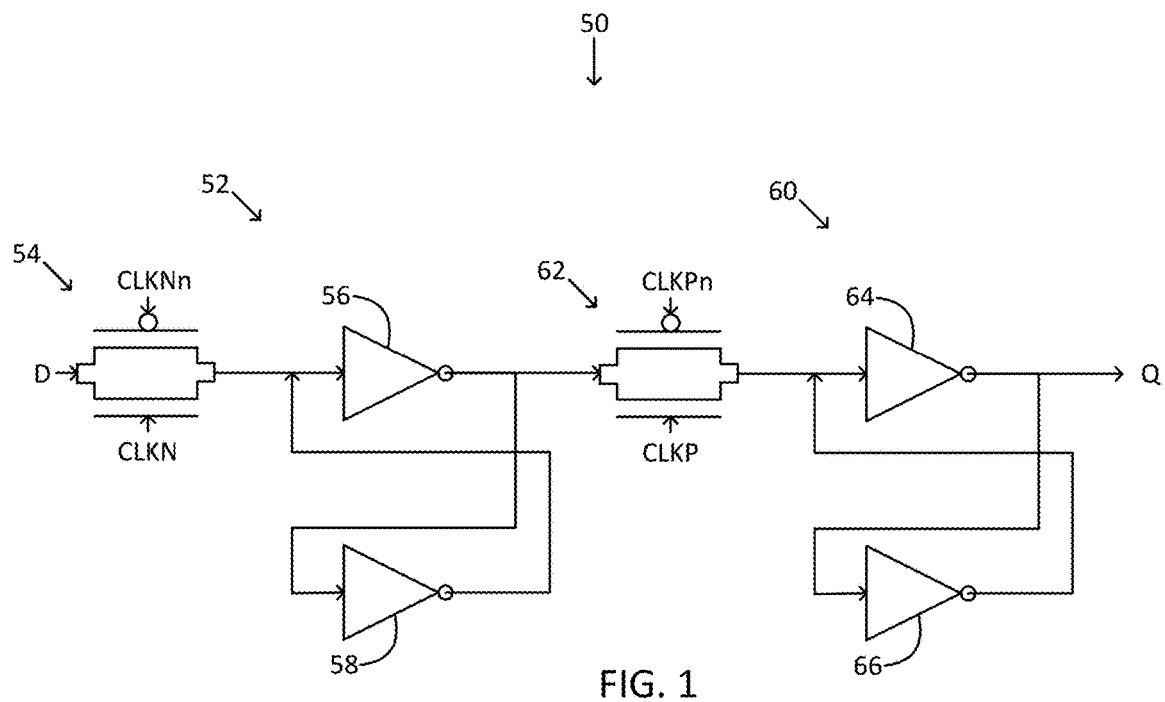
FIG. 1 is a schematic diagram of a flip flop constructed from master and slave latches, in accordance with this disclosure.

With reference to FIG. 1, a flip flop 50 used in the construction of a shift register (described below) is now described. The flip flop 50 is constructed from a master latch 52 chained or connected in series with a slave latch 60, meaning that the output of the master latch 52 is fed to the data input of the slave latch 60. The data input of the master latch 52 serves as the data "D" input of the flip flop 50, and the data output of the slave latch 60 serves as the data "Q" output of the flip flop 50.

The master latch 52 is comprised of a pass gate 54 receiving the data input "D", and selectively passing the received signal to a pair of cross coupled inverters 56 and 58. The pass gate 54 is clocked by clock signal CLKN and its inverse CLKNn. The slave latch 60 is comprised of a pass gate 62 receiving, as its input, the output from the master latch 52. The pass gate 62 is clocked by the clock signals CLKP and its inverse CLKPn, and selectively passes the received signal to cross coupled inverters 64 and 66. The output of inverter 64 provides the data output "Q" of the flip flop 50.

Figure 2:
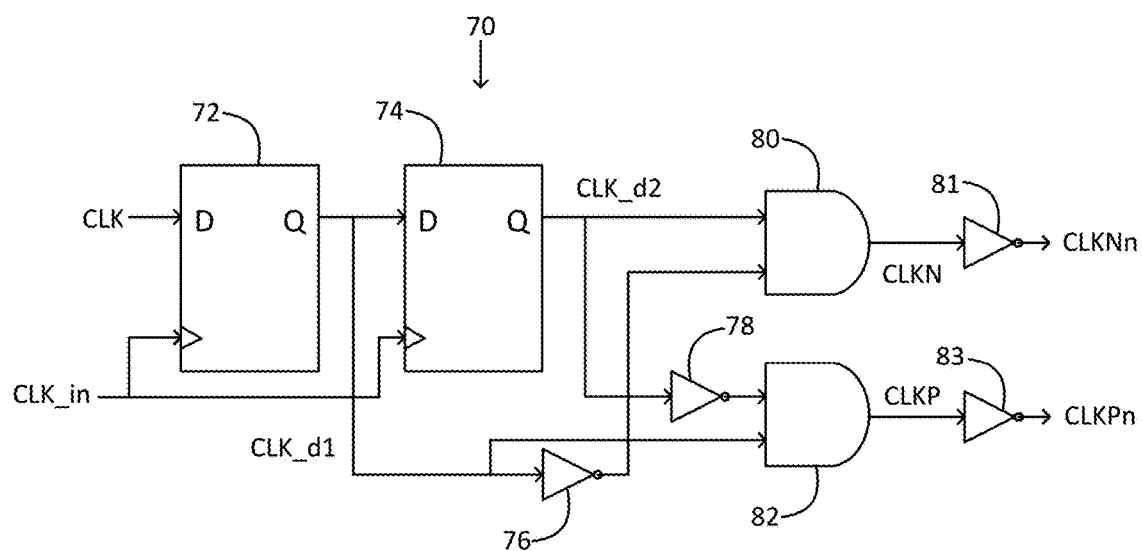
FIG. 2 is a block diagram of a clock generation circuit for use by the flip flop of FIG. 1.

The clock signals CLKN, CLKNn, CLKP, and CLKPn are generated by a clock generation circuit 70, which is now described with additional reference to FIG. 2. The clock generation circuit 70 includes a flip flop 72 that receives device clock CLK at its data input and is clocked by an input clock CLK_in. The input clock CLK_in has a higher frequency than the device clock CLK.

Flip flop 72 provides at output Q a signal CLK_d1 to the data input of flip flop 74, which is also clocked by the input clock CLK_in. The output of flip flop 74 provides a signal CLK_d2. Inverter 76 inverts CLK_d1, and this inverted signal is received by AND gate 80 as input, which also receives CLK_d2 as its other input. The output of AND gate 80 is the clock signal CLKN, which is inverted by inverter 81, and output as the clock signal CLKNn. Inverter 78 inverts CLK_d2, and this inverted signal is received by AND gate 82, which also receives CLK_d1 as its other input. The output of AND gate 82 is the clock signal CLKP, which is inverted by inverter 83, and output as the clock signal CLKPn.

Figure 3:
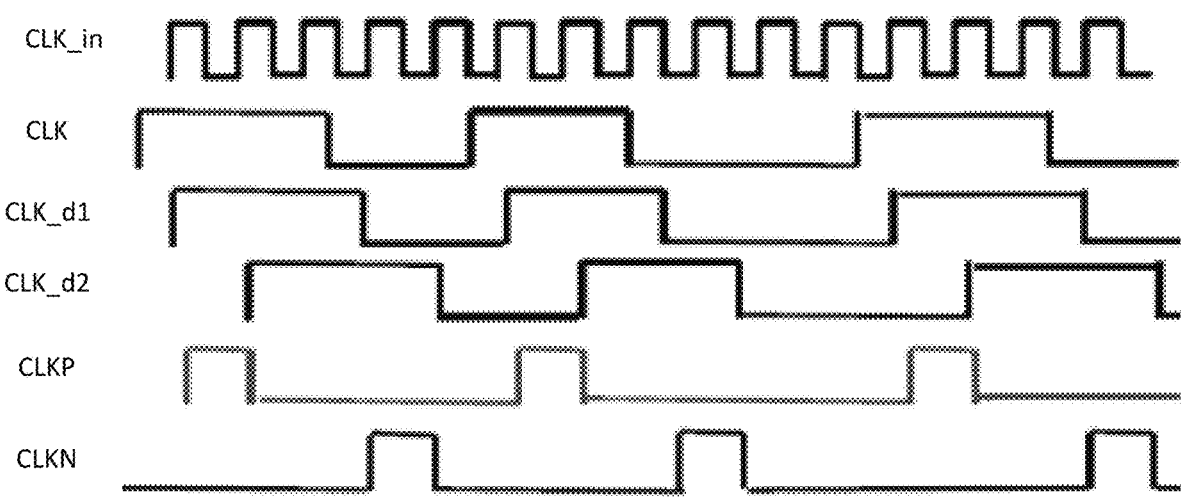
FIG. 3 is a timing diagram of the flip flop of FIG. 1 in operation.

Generation of the clock signals CLKN, CLKNn, CLKP, and CLKPn is now described with additional reference to FIG. 3. CLK_in is the high frequency clock used to clock the flip flops 72 and 74. If the device clock CLK is not synchronized with CLK_in, the flip flop 72 will resynchronize the device clock CLK as the intermediate clock CLK_d1. The output of the flip flop 74 produces CLK_d2 which is a one clock period delayed version of CLK_d1. The logical ANDing of CLK_d1 and the inverse of CLK_d2 produces the clock signal CLKP. The ANDing of the inverse of CLK_d1 and CLK_d2 produces CLKN. CLKPn and CLKNn are the inverted versions of CLKP and CLKN, respectively. As can be seen in the timing diagram, there are large delays between pulses of CLKP and CLKN. This results in operation of the flip flop 50 not being sensitive to process, temperature, and voltage variations.

Figure 4:
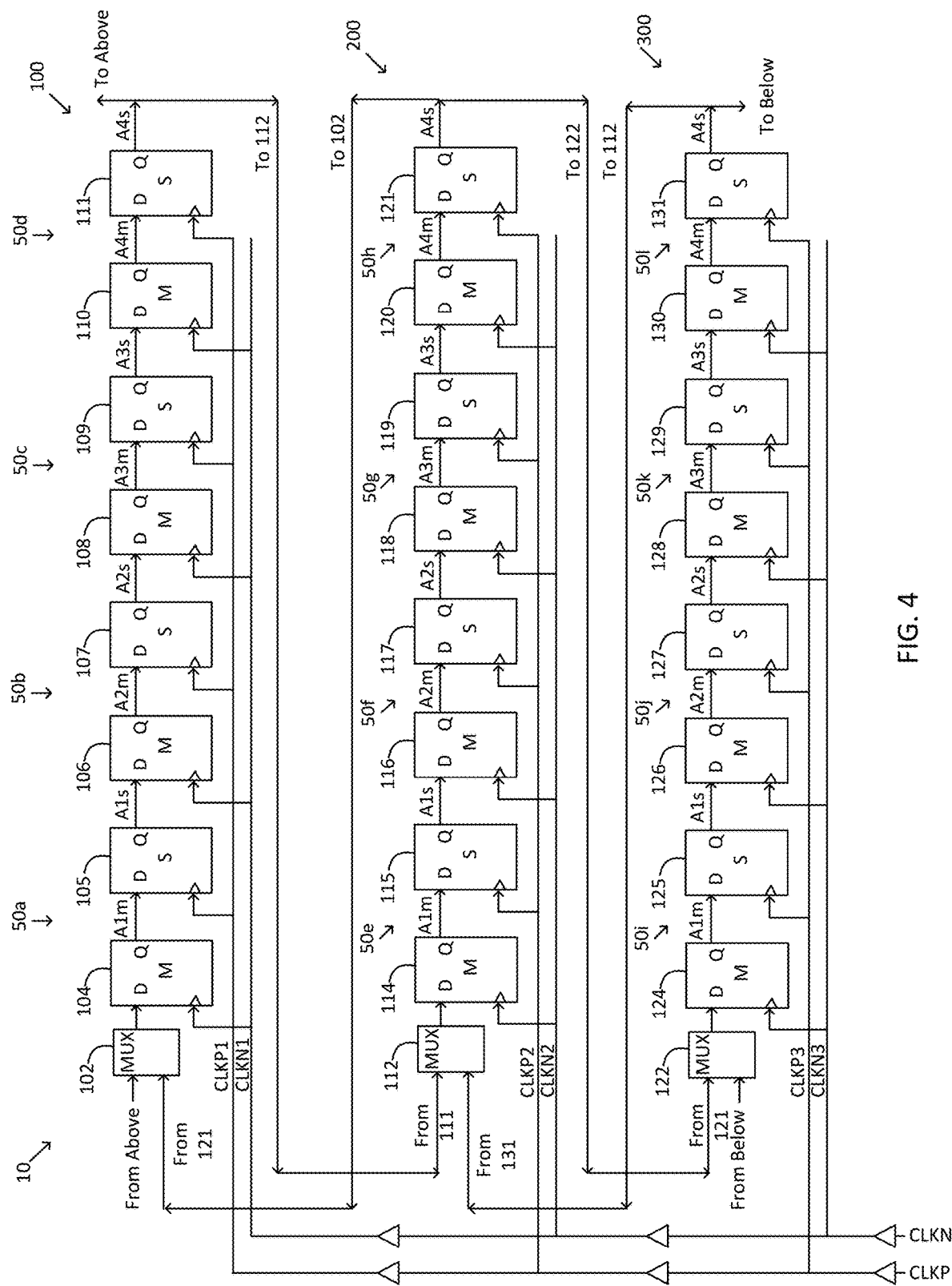
FIG. 4 is a block diagram of a shift register constructed from the flip flops of FIG. 1, as clocked by the clock generation circuit of FIG. 2.

The use of the flip flop 50 in a shift register 10 is now described with reference to FIG. 4. The shift register 10 illustratively includes three flip flop chains 100, 200, and 300. Multiplexer 102 provides the input to the flip flop chain 100, and this input is either the output of flip flop chain 200, or the output of a flip flop chain above flip flop chain 100. The flip flop chain 100 includes a series of chained flip flops 50a-50d, which as explained above comprise a series of chained master and slave latches, 104-111, with the master latches 104, 106, 108, and 110 being clocked by CLKN1 (a buffered version of CLKN2), and the slave latches 105, 107, 109, and 111 being clocked by CLKP1 (a buffered version of CLKP2). The master latch 104 and slave latch 105 form flip flop 50a, the master latch 106 and slave latch 107 form flip flop 50b, the master latch 108 and slave latch 109 form flip flop 50c, and the master latch 110 and slave latch 111 form flip flop 50d.

Multiplexer 112 provides the input to the flip flop chain 200, and this input is either the output of flip flop chain 100, or the output of flip flop chain 300. The flip flop chain 200 includes a series of chained flip flops 50e-50h, shown as a series of chained master and slave latches, 114-121, with the master latches 114, 116, 118, and 120 being clocked by CLKN2 (a buffered version of CLKN3), and the slave latches 115, 117, 119, and 121 being clocked by CLKP2 (a buffered version of CLKP3). The master latch 114 and slave latch 115 form flip flop 50e, the master latch 116 and slave latch 117 form flip flop 50f, the master latch 118 and slave latch 119 form flip flop 50g, and the master latch 120 and slave latch 121 form flip flop 50h.

Multiplexer 122 provides the input to the flip flop chain 300, and this input is either the output of a flip flop chain below, or the output of flip flop chain 200. The flip flop chain 300 includes a series of chained flip flops 50i-50l, shown as a series of master and slave latches, 124-131, with the master latches 124, 126, 128, and 130 being clocked by CLKN3 (a buffered version of CLKN), and the slave latches 125, 127, 129, and 131 being clocked by CLKP3 (a buffered version of CLKP). The master latch 124 and slave latch 125 form flip flop 50i, the master latch 126 and slave latch 127 form flip flop 50j, the master latch 128 and slave latch 129 form flip flop 50k, and the master latch 130 and slave latch 131 form flip flop 50l.

Through the use of the multiplexers 102, 112, and 122 selectively switching the order in which the flip flop chains 100, 200, and 300 are coupled, bidirectional data shifting is enabled. It should be appreciated that if the flip flop chain 100 or 300 is to serve as the data input of the shift register 100, the respective multiplexer 102 or 122 associated with the flip flop chain 100 or 300 receives the data input as one of its inputs.

Figure 5:
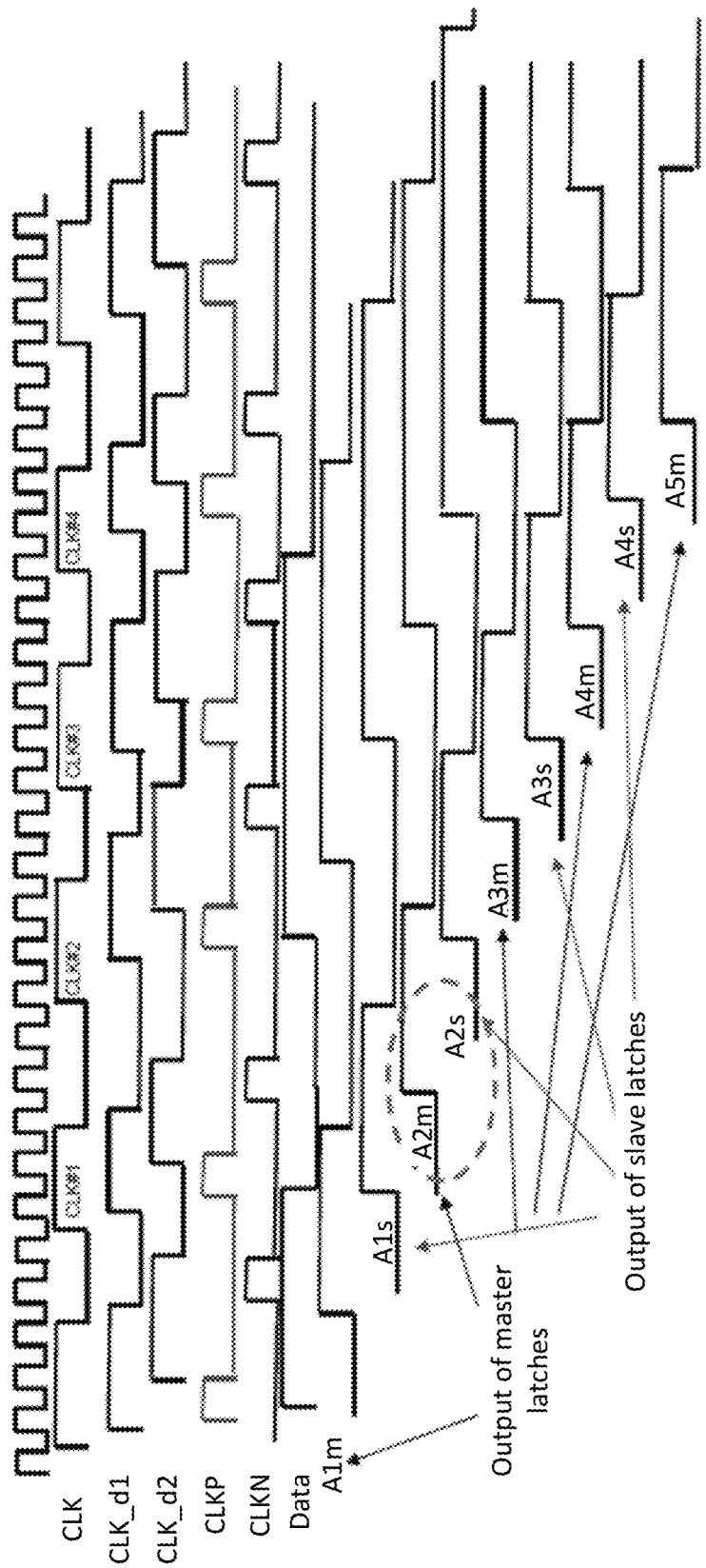
FIG. 5 is a timing diagram of the shift register of FIG. 4 in operation.

As can be seen in the timing diagram of FIG. 5, and as stated above, there are large delays between pulses of CLKP and CLKN. The resulting robustness of the shift register 10 in the face of process, temperature, and voltage variations means that the shift register does not have issues with shifting data across large areas. The serial buffering of clocks CLKP and CLKN serves to distribute switching current across the chip incorporating the shift register 10.

Due to the use of the dual clocks CLKP and CLKN, generated as described above, the shift register 100 is free of hold time violations. That is, there is no issue with shifting data between flip flops in the same row, as well as shifting data between rows.

In operation, during positive pulses of CLKN, the master latches 104, 106, 108, 110, 114, 116, 118, 120, 124, 126, 128, and 130 are updated by the respective previous slave latches 105, 107, 109, 111, 115, 117, 119, 121, 125, 127, 129, and 131 which have not had their data change due to the time delay between the CLKP and CLKN pulses. The slave latches 105, 107, 109, 111, 115, 117, 119, 121, 125, 127, 129, and 131 are updated by the respective master latches 104, 106, 108, 110, 114, 116, 118, 120, 124, 126, 128, and 130 during the positive pulse of CLKP, and these master latches have not had their data change due to the time delay between the CLKP and CLKN pulses. This timing of the outputs of the latches 104-111, 114-121, 124-131 can be seen in FIG. 5. As stated, due to the time delay between the clocks CLKP and CLKN, there are no hold time violations. Hence, it can be seen that the shift register 10 is robust and functionally not sensitive to process, temperature and voltage variations.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   clock generation circuitry comprising:
   a first flip flop configured to receive a device clock, wherein the first flip flop is triggered by an input clock;
   a second flip flop configured to receive an output from the first flip flop, wherein the second flip flop is triggered by the input clock;
   a first logic circuit configured to generate a first clock signal by logically combining the output from the first flip flop and an output from the second flip flop; and
   a second logic circuit configured to generate a second clock signal by logically combining the output from the first flip flop and the output from the second flip flop.

2. The electronic device of claim 1, wherein the first logic circuit is configured to generate the first clock signal by logically ANDing the output from the second flip flop and a complement of the output of the first flip flop.

3. The electronic device of claim 1, wherein the first logic circuit is configured to generate the first clock signal by logically NANDing the output from the second flip flop and a complement of the output of the first flip flop.

4. The electronic device of claim 1, wherein the second logic circuit is configured to generate the second clock signal by logically ANDing the output from the first flip flop and a complement of the output of the second flip flop.

5. The electronic device of claim 1, wherein the second logic circuit is configured to generate the second clock signal by logically NANDing the output from the first flip flop and a complement of the output of the second flip flop.

6. The electronic device of claim 1, wherein the first logic circuit comprises:
   a first inverter receiving the output from the first flip flop as input; and
   a first AND gate receiving, as input, the output from the second flip flop and an output from the first inverter, and configured to generate a first intermediate clock signal as output.

7. The electronic device of claim 6, wherein the first logic circuit further comprises an inverter receiving the first intermediate clock signal and complementing the first intermediate clock signal so as to generate the first clock signal.

8. The electronic device of claim 6, wherein the second logic circuit further comprises:
   a second inverter receiving output from the second flip flop as input; and
   a second AND gate receiving, as input, the output from the first flip flop and an output from the second inverter, and configured to generate a second intermediate clock signal as output.

9. The electronic device of claim 8, wherein the second logic circuit further comprises an inverter receiving the second intermediate clock signal and complementing the second intermediate clock signal so as to generate the second clock signal.

10. The electronic device of claim 6, further comprising:
    at least one buffer coupled to receive the first clock and configured to buffer the first clock signal, and
    at least one buffer coupled to receive the second clock and configured to buffer the second clock signal.

11. An electronic device, comprising:
    clock generation circuitry comprising:
    a first flip flop configured to receive a device clock, wherein the first flip flop is triggered by an input clock;

a second flip flop configured to receive an output from the first flip flop, wherein the second flip flop is triggered by the input clock;

a first inverter receiving output from the first flip flop as input;

a second inverter receiving output from the second flip flop as input;

a first AND gate receiving, as input, outputs from the second flip flop and the first inverter, and configured to generate a first clock as output; and a second AND gate receiving, as input, outputs from the first flip flop and the second inverter, and configured to generate a second clock as output.

12. The electronic device of claim 11, further comprising:
at least one buffer coupled to receive the first clock and configured to buffer the first clock, and
at least one buffer coupled to receive the second clock and configured to buffer the second clock.

13. The electronic device of claim 11, further comprising a first inverter configured to generate a first clock signal as a complement of the first clock output by the first AND gate.

14. The electronic device of claim 11, further comprising a second inverter configured to generate a second clock signal as a complement of the second clock output by the second AND gate.

15. A method, comprising:
synchronizing a device clock to an input clock to generate a first intermediate clock;
delaying the first intermediate clock by one clock period to produce a second intermediate clock;
generating a first clock signal by logically ANDing the second intermediate clock and an inverse of the first intermediate clock; and
generating a second clock signal by logically ANDing the first intermediate clock and an inverse of the second intermediate clock.

16. The method of claim 15, further comprising complementing the first and second clock signals to produce, respectively, first and second complemented clock signals.

17. The method of claim 16, further comprising shifting data through a flip flop chain by controlling master latches of flip flops of the flip flop chain based upon the first complemented clock signal and by controlling slave latches of the flip flops of the flip flop chain based upon the second complemented clock signal.

18. The method of claim 15, further comprising buffering the first and second clock signals.

* * * * *